US009184483B2

(12) United States Patent
Zeller et al.

(10) Patent No.: US 9,184,483 B2
(45) Date of Patent: Nov. 10, 2015

(54) DIRECTIONAL COUPLER

(75) Inventors: Gerhard Zeller, München (DE); Manfred Stadler, Seiersberg (AT); Edgar Schmidhammer, Stein an der Traun (DE); Pasi Tikka, München (DE)

(73) Assignee: Epcos AG, Munich (DE)

(*) Notice: Subject to any disclaimer, the term of this patent is extended or adjusted under 35 U.S.C. 154(b) by 184 days.

(21) Appl. No.: 13/883,613

(22) PCT Filed: Nov. 21, 2011

(86) PCT No.: PCT/EP2011/070588

§ 371 (c)(1), (2), (4) Date: Jul. 19, 2013

(87) PCT Pub. No.: WO2012/084379

PCT Pub. Date: Jun. 28, 2012

(65) Prior Publication Data

US 2013/0293317 A1 Nov. 7, 2013

(30) Foreign Application Priority Data

Dec. 22, 2010 (DE) ........................ 10 2010 055 671

(51) Int. Cl.
*H01P 5/18* (2006.01)
*H03H 7/38* (2006.01)

(52) U.S. Cl.
CPC *H01P 5/18* (2013.01); *H01P 5/185* (2013.01); *H01P 5/187* (2013.01)

(58) Field of Classification Search
CPC .................................... H01P 5/12; H01P 5/18
USPC .................................. 333/109–112, 116–118
See application file for complete search history.

(56) References Cited

U.S. PATENT DOCUMENTS 4,216,446 A * 8/1980 Iwer .............................. 333/112
5,576,669 A * 11/1996 Ruelke .......................... 333/116

(Continued)

FOREIGN PATENT DOCUMENTS

CN 1419313 5/2003
FR 2798789 A1 3/2001

(Continued)

OTHER PUBLICATIONS

International Search Report corresponding to co-pending International Patent Application Serial No. PCT/EP2011/070588, European Patent Office, dated Feb. 29, 2012; (3 pages).

*Primary Examiner* — Dean Takaoka
(74) *Attorney, Agent, or Firm* — Nixon Peabody LLP

(57) ABSTRACT

A directional coupler, comprising a first high-frequency line for feeding a first high-frequency signal, a second high-frequency line for feeding a second high-frequency signal, and a coupling line for outputting signals from the first and the second high-frequency lines, wherein the coupling line comprises resistive segments, each comprising a predetermined impedance. Coupling properties and resistive damping and adapting properties can be integrated in the coupling line. A compact and low-cost construction of the directional coupler is thus made possible.

12 Claims, 3 Drawing Sheets

(56) References Cited

U.S. PATENT DOCUMENTS

| | | | | |
|---|---|---|---|---|
| 5,884,149 | A * | 3/1999 | Jaakola | 455/103 |
| 6,470,191 | B1 * | 10/2002 | Nielsen et al. | 455/552.1 |
| 6,496,708 | B1 | 12/2002 | Chan et al. | |
| 6,759,922 | B2 * | 7/2004 | Adar et al. | 333/109 |
| 6,972,638 | B2 * | 12/2005 | Usami et al. | 333/109 |
| 2004/0000965 | A1 | 1/2004 | Usami et al. | |
| 2009/0045888 | A1 | 2/2009 | Wren | |
| 2009/0128255 | A1 | 5/2009 | Dupont et al. | |
| 2010/0171564 | A1 * | 7/2010 | Yamamoto et al. | 333/116 |

FOREIGN PATENT DOCUMENTS

| | | | |
|---|---|---|---|
| JP | 2001-44719 | A | 2/2001 |
| JP | 2004-40259 | A | 2/2004 |
| JP | 2005-168060 | A | 6/2005 |
| JP | 2005-203824 | A | 7/2005 |
| JP | 2007025838 | A | 2/2007 |
| JP | 2009-44303 | A | 2/2009 |
| WO | WO 2005/102910 | A1 | 3/2005 |
| WO | WO 2005/076404 | A | 8/2005 |
| WO | WO 2012/084379 | A1 | 6/2012 |

* cited by examiner

DIRECTIONAL COUPLER

CROSS-REFERENCE TO RELATED APPLICATIONS

This application is a U.S. National Stage of International Application No. PCT/EP2011/070588, filed Nov. 21, 2011, which claims the benefit of Germany Patent Application No. 102010055671.8, filed on Dec. 22, 2010, both of which are incorporated herein by reference in their entireties.

FIELD OF THE INVENTION

The invention relates to a directional coupler for detecting signals proportional to high-frequency signals of propagating electromagnetic waves in high-frequency lines.

BACKGROUND OF THE INVENTION

Directional couplers are used for detecting signal properties of propagating high-frequency signals, that is, electromagnetic waves in high-frequency lines. A portion of the high-frequency signals is directionally coupled out of a high-frequency line via a coupling line. These signals can be tapped via measurement connections of the coupling line and evaluated in a detector. This makes it possible to assess the quality of the propagating high-frequency signals. For example, it is possible to assess the magnitude, the transmitted power, or the phase of a high-frequency signal on a high-frequency line. Typical coupling losses, that is, components of the power level of the propagating high-frequency signals that are coupled out can, for example, fall between −3 dB and −20 dB.

Directional couplers are widely used for the directional detection of power differences between an outgoing and returning electromagnetic wave in a signal path, in order to be able to calculate the so-called voltage standing wave ratio (VSWR). The voltage standing wave ratio is a measure of power losses of electromagnetic waves that are caused, for example, by reflection due to mismatched line segments in the signal path having impedance discontinuities.

In electronic communication terminals such as mobile telephones or other wireless transmitting/receiving units, a plurality of frequency ranges (frequency bands) is used to transmit information and data, for example, bands between 700 MHz and 1000 MHz or between 1400 MHz and 6000 MHz.

In conventional solutions, a directional coupler is employed for each frequency band that is used in order to detect signal properties of the propagating high-frequency signals in this frequency band. For example, the power of a propagating electromagnetic wave between a transmitter and an antenna is detected in order to enable a controlled ramping up of the power of a power amplifier in the transmitter. Furthermore, the power of an outgoing and returning electromagnetic wave between the transmitter and the antenna can be detected in order to detect a mismatch and to effect an impedance match between the transmitter and the antenna.

The line lengths of the coupling line and the lines between the directional coupler and a detector that is connected to it for measuring the coupled-out signals generally depend on the respective frequency band and are therefore different. Different line lengths result from the fact that for certain functions, a line length that is dependent on the wavelength, for example, a quarter or half of the wavelength, is specified.

A stable and defined coupling in the directional coupler must be ensured despite different line lengths for different frequency bands. This is true for the detection of both outgoing and returning waves. In order to match a directional coupler to the employed frequency band and if necessary also to the resulting line length between the directional coupler and the detector, a conventional directional coupler can have resistive attenuators between the coupling line and the measurement connections in the direction of the detector. The attenuators are constructed via discrete resistors in a PI or T form.

All of these requirements—different frequency bands, the use of directional couplers in different settings, discrete resistive matching elements—result in a costly directional coupler for different frequency bands that requires a large amount of space.

BRIEF SUMMARY

The object of the invention is therefore to improve a directional coupler in such a way that a lower space requirement and lower costs can be achieved for the directional coupler.

This object is achieved through a directional coupler of the kind initially specified, comprising a first high-frequency line for carrying a first high-frequency signal, a second high-frequency line for carrying a second high-frequency signal, and a coupling line for coupling out signals from the first and the second high-frequency line, wherein the coupling line has resistive segments that respectively have a predetermined impedance.

A directional coupler of this kind has the advantage that discrete resistors are no longer necessary and are advantageously completely omitted. Here, a discrete resistor is to be understood as an individual electrical resistance component, for example, located in its own housing and having its own external connections. Resistive line segments having predetermined impedance are integrated into the coupling line. This coupling line fulfills a coupling function and has predetermined resistive properties. It is thus possible to save space that was required in conventional solutions. The directional coupler can be constructed as a compact and advantageously integrated component or device, thus making it possible to save space and costs.

The coupling line is advantageously equipped to couple out signals of a first frequency range from the first high-frequency line and signals of a second frequency range from the second high-frequency line. This means that the directional coupler can be used in parallel for different frequency ranges. Outgoing and returning waves of propagating high-frequency signals of different frequency ranges can thus be directionally coupled out using a single directional coupler. This also saves costs, since it is possible to use just one directional coupler instead of a plurality of directional couplers for different frequency bands.

The resistive segments of the coupling line are preferably arranged such that one or a plurality of resistive matching elements are formed for matching coupled-out signals. Matching elements that were previously realized via discrete components, that is, resistors, can be constructed via the resistive segments of the coupling line, wherein each resistive segment has a predetermined impedance. By selectively arranging the segments in the coupling line, it is therefore possible to match the directional coupler to the frequency ranges used by the high-frequency signals.

In particular, the matching elements can be advantageously equipped to attenuate the coupled-out signals of at least one of the frequency ranges and/or to match the impedance of the directional coupler in at least one of the frequency ranges. The resistive matching elements are advantageously arranged in a PI form. The matching elements form one or a plurality of PI elements for matching in one or a plurality of frequency ranges.

These properties allow matching of the dynamic range of the coupled-out signals to components and elements that are downstream from the directional coupler, for example, logarithmic amplifiers. In addition, the impedance of the directional coupler can be matched to the impedances of the coupled lines and elements, making it possible to obtain the best-possible coupling having a good coupling factor for each of the employed frequency ranges.

According to one embodiment, the coupling line is implemented from printed conductive paths and has measurement connections for tapping the coupled-out signals, as well as one or a plurality of ground connections. The conductive paths of the coupling line are advantageously arranged in a common plane. A configuration of the directional coupler is preferably designed such that the coupling line comprises a central segment for conducting coupled-out signals between the measurement connections, as well as additional segments, which respectively originate with a first end at the central segment, lead away from this central segment, and are respectively connected with their second end to one of the ground connections.

Such an embodiment of the coupling line enables an effective dimensioning of resistive attenuation and matching elements in the coupling line. A plurality of segments, for example, the central segment and two segments that originate there and which are, for example, connected to ground, produce a matching element. The conductive paths of the coupling line are thus equipped such that the coupling line fulfills both the function of coupling out high-frequency signals from the high-frequency lines and matching the coupled-out signals through the integration of resistive matching elements in the coupling line. The configuration of the directional coupler enables a particularly compact type of construction with outstanding coupling and attenuation properties.

Additional advantageous embodiments are disclosed in the dependent claims and in the following description of the figures.

BRIEF DESCRIPTION OF THE DRAWINGS

The invention is explained below by means of a number of drawings. The following are shown.

DETAILED DESCRIPTION

Figure 1:
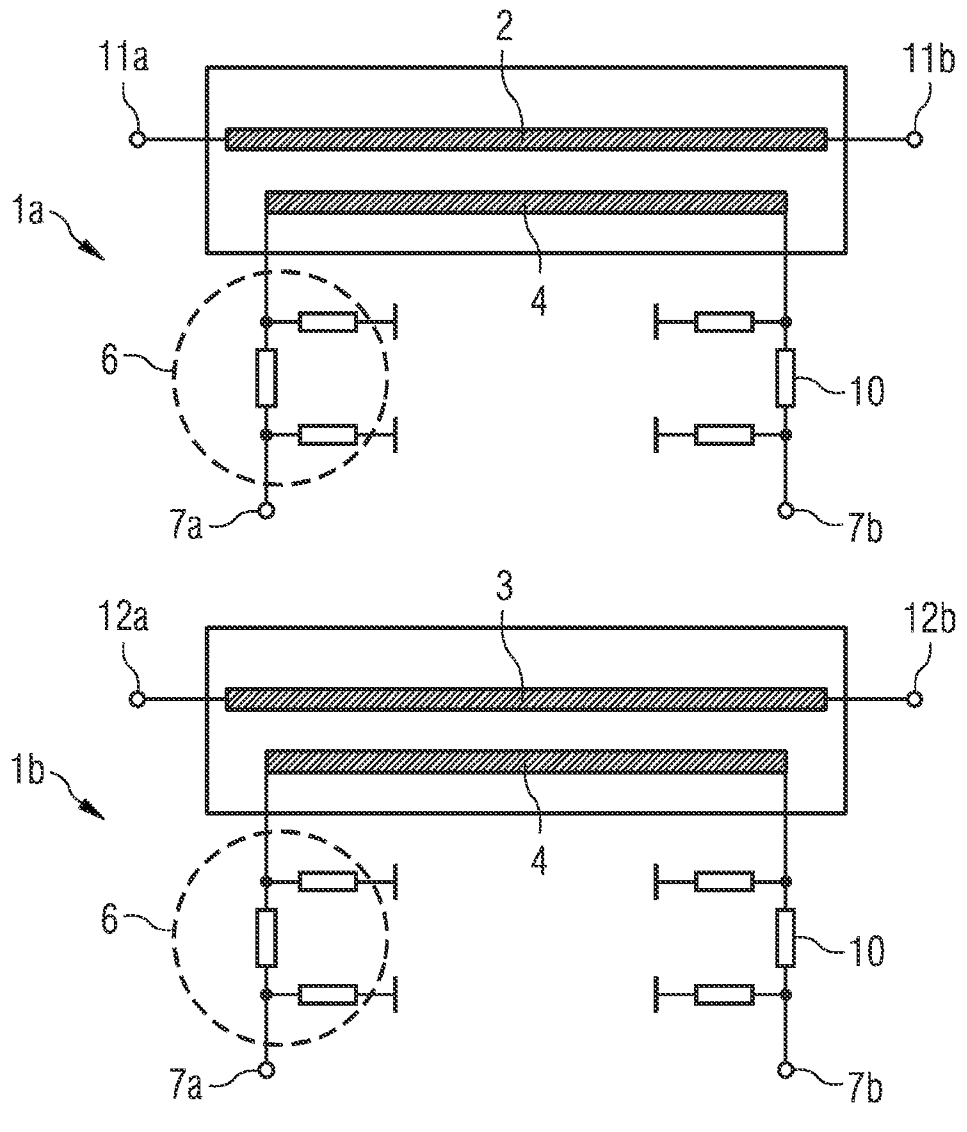
FIG 1 (Prior Art)
FIG. 1 A schematic representation of two conventional directional couplers for different frequency bands, FIG. 2*a* A schematic representation of a first embodiment of a directional coupler for two different frequency ranges, FIG. 2*b* A detailed schematic representation of the embodiment according to FIG. 2*a*, and FIG. 3 A perspective representation of an embodiment of a directional coupler.

FIG. 1 shows a schematic diagram of the circuit configuration of two conventional directional couplers 1*a* and 1*b* for different frequency ranges. A first directional coupler 1*a* has a first high-frequency line 2 having connections 11*a* and 11*b* for carrying a first high-frequency signal in a first frequency range. A coupling line 4 serves to couple out a portion of a propagating high-frequency signal in the first high-frequency line 2. The coupled-out signal can be detected via the coupling line 4 by a downstream detector at measurement connections 7*a* or 7*b*. A downstream detector can, for example, have a logarithmic amplifier for performing signal processing of the coupled-out high-frequency signals. However, a corresponding detector is not shown. Discrete resistors 10 are respectively connected between the coupling line 4 and the two connections 7*a* and 7*b* for matching the directional coupler 1*a* to the frequency range of the high-frequency signal propagating in the first high-frequency line 2 and for attenuating and matching the dynamic range of a coupled-out signal.

Three resistors 10, which may respectively have different values, are respectively connected to a matching element 6 between the coupling line 4 and a measurement connection 7*a* or 7*b*. The arrangement shown here of the resistors 10 in a matching element 6 corresponds to a so-called PI circuit. Attenuation of the coupled-out signals occurs via the matching elements 6 located between the coupling line 4 and the connections 7*a* and 7*b*, and thus the dynamic range of the coupled-out signals is matched to a low dynamic range of an amplifier of a downstream detector, which, for example, can be several decades lower. Furthermore, by suitably dimensioning the matching elements 6, it is possible to adjust the coupling factor, the isolation, and the directivity (ratio of the coupled-out powers) between the connections 11*a* and 11*b* and the measurement outputs 7*a* and 7*b*.

If the resistors 10 on the input or output side of a matching element 6, that is, the two resistors 10 that are connected to ground potential, have different values, an impedance match occurs simultaneously with the attenuation via the matching element 6. Impedance matching of the directional coupler 1*a* is necessary, for example, in order to match the directional coupler 1*a* to an impedance of the first high-frequency line 2 and to an impedance of a downstream detector, in order to keep reflections and thus power losses as low as possible and to improve a coupling of high-frequency signals from the first high-frequency line 2 into the coupling line 4. Common impedance values can have, for example, an impedance of 50Ω as known from radio and radar engineering or an impedance of 75Ω as known from antenna systems for terrestrial, cable, and satellite television. Other impedance values are of course conceivable.

Another directional coupler 1*b* that is constructed identically to the directional coupler 1*a* described above serves to couple out high-frequency signals from a second high-frequency line 3 in a second frequency range that can be different from the first frequency range of the first high-frequency line 2 of the directional coupler 1*a*, using connections 12*a* and 12*b*. The directional coupler 1*b* has a structure that is identical to that of the directional coupler 1*a*. Because of the different frequency range in which the directional coupler 1*b* works in comparison to the directional coupler 1*a*, the impedance values of the resistors 10 and consequently the attenuation and impedance of the matching elements 6 of the directional coupler 1*b* can simply have other values.

The two directional couplers 1*a* and 1*b* in FIG. 1 are used to couple from different high-frequency lines 2 and 3 having different frequency ranges. Due to this fact and due to the use of discrete resistors 10 in matching elements of the two directional couplers 1*a* and 1*b*, the arrangement in FIG. 1 requires a relatively large construction volume, meaning that the cost of constructing the arrangement is high.

Figure 2A:
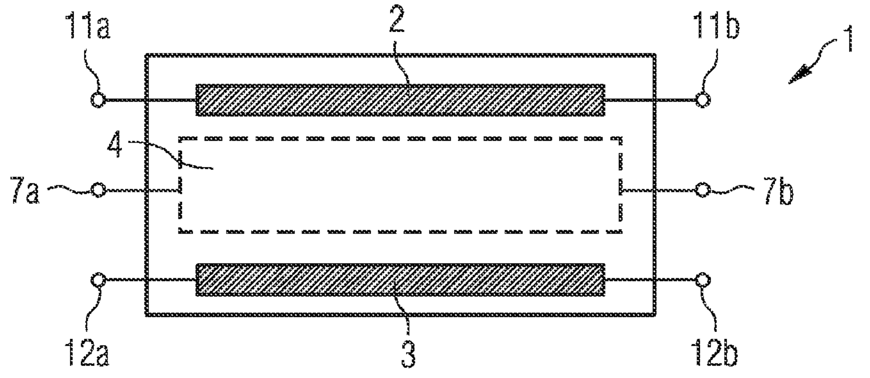

FIG. 2*a* shows a schematic diagram of a circuit of a possible embodiment of a directional coupler 1 according to the invention. This directional coupler 1 effectively represents a combination and merging of the two directional couplers 1*a* and 1*b* in FIG. 1. The directional coupler 1 according to FIG. 2*a* has a first high-frequency line 2 with connections 11*a* and 11*b* and a second high-frequency line 3 with connectors 12*a* and 12*b*. The two high-frequency lines 2 and 3 carry high-frequency signals of different frequency ranges. The high-frequency line 2 thus carries, for example, high-frequency signals of a frequency band in the 1-GHz frequency range, and the high-frequency line 3 carries high-frequency signals of a frequency band in the 2-GHz frequency range. The two frequency ranges are separated from each other by a sufficiently large band gap.

To couple out high-frequency signals from the two high-frequency lines 2 and 3, the directional coupler 1 furthermore has a coupling line 4 with measurement connections 7*a* and 7*b* for detecting coupled-out signals via a detector (not shown) that is connected to the connections 7*a* and 7*b*. The directional coupler 1 according to FIG. 2*a* integrates a coupling from the high-frequency lines 2 and 3 into the coupling line 4 and resistive matching properties in the coupling line 4, as explained below. The directional coupler 1 can thus be constructed in a substantially more compact and cost-effective manner than an arrangement of two directional couplers 1*a* and 1*b* according to FIG. 1, and still serves to detect signal properties of two different high-frequency lines 2 and 3.

Figure 2B:
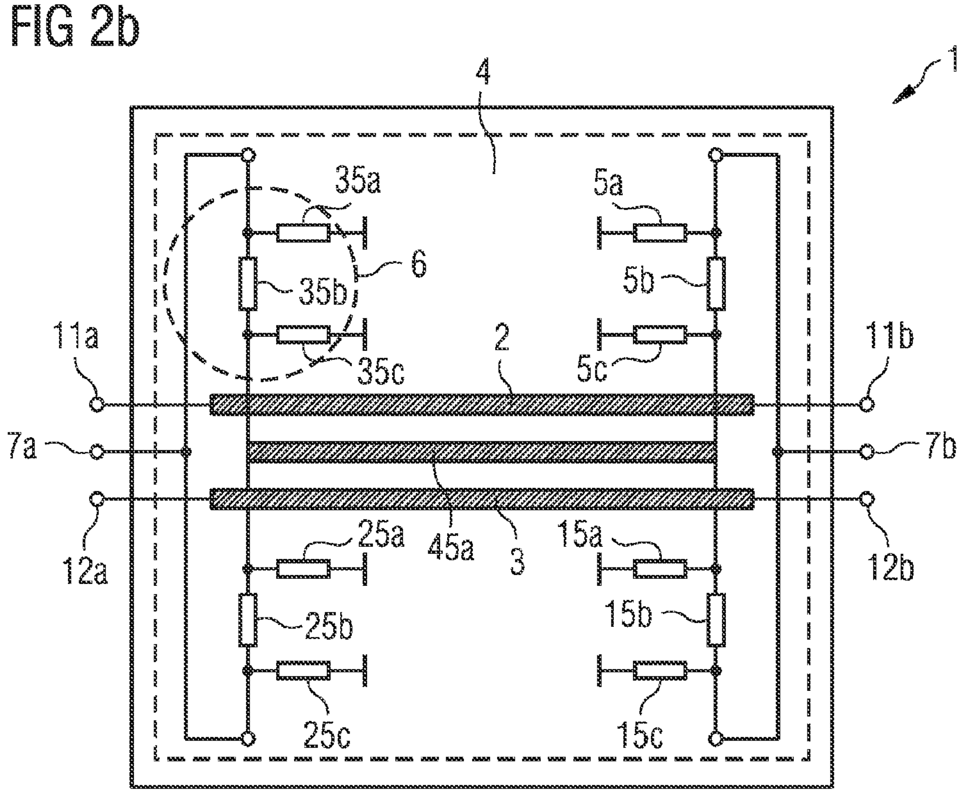

FIG. 2*b* shows a schematic diagram of an alternative circuit diagram of the directional coupler 1 according to FIG. 2*a*. In particular, the technical circuit configuration of the coupling line 4 is explained in greater detail in FIG. 2*b*.

The coupling line 4 has a plurality of segments 5*a*, 5*b*, 5*c*, 15*a*, 15*b*, 15*c*, 25*a*, 25*b*, 25*c*, 35*a*, 35*b*, and 35*c* that have resistive properties having predefined impedance values. These impedance values are symbolically represented by resistive elements. A segment 45*a* is arranged between the two high-frequency lines 2 and 3 and is equipped to couple out high-frequency signals from the two high-frequency lines 2 and 3. The segment 45*a* likewise has a predetermined impedance value.

In addition to a function of coupling electromagnetic signals from the two high-frequency lines 2 and 3, the coupling line 4 also has resistive properties. Segments 5*a* to 5*c*, 15*a* to 15*c*, 25*a* to 25*c*, and 35*a* to 35*c* are respectively arranged such that matching elements 6 result. Segments 5*a* to 5*c*, 15*a* to 15*c*, 25*a* to 25*c*, and 35*a* to 35*c* are respectively arranged such that the matching elements 6 are constructed in a PI form.

All segments 5*a*, 5*b*, 5*c*, 15*a*, 15*b*, 15*c*, 25*a*, 25*b*, 25*c*, 35*a*, 35*b*, 35*c*, and 45*a* are respectively allowed to have different impedance values. This is particularly advantageous if different attenuation properties are to be achieved for different frequencies of the two high-frequency lines 2 and 3.

It is thus possible to predetermine attenuation properties via the resistive segments 5*a*, 5*b*, 5*c*, 15*a*, 15*b*, 15*c*, 25*a*, 25*b*, 25*c*, 35*a*, 35*b*, 35*c*, and 45*a* of the coupling line 4 that develop the attenuation and matching effects that have already been explained in reference to FIG. 1 for high-frequency signals that are coupled out of the high-frequency lines 2 and 3. It is thus possible to match the directional coupler 1 according to FIGS. 2*a* and 2*b* to impedances of the high-frequency lines 2 and 3 and to impedances of one or a plurality of downstream detectors at the measurement connections 7*a* and 7*b*. The dynamic range of coupled-out signals can likewise be matched to dynamic ranges of one or a plurality of downstream detectors. Resistive attenuation properties and a coupling of high-frequency signals from the high-frequency lines 2 and 3 are integrated into the coupling line 4 of the directional coupler 1 according to FIGS. 2*a* and 2*b*.

Figure 3:
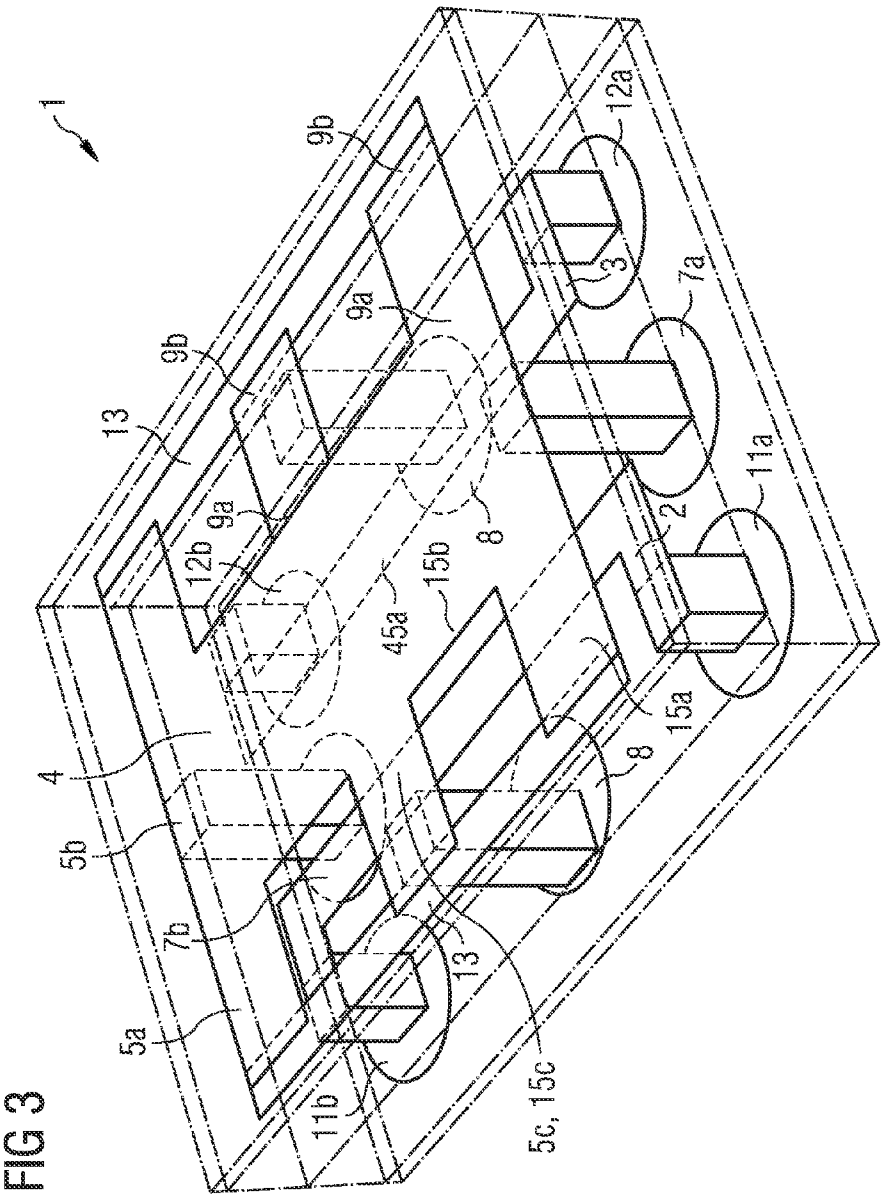

FIG. 3 shows a perspective schematic representation of an example of a device acting as a directional coupler 1. The directional coupler 1 is constructed in terms of circuitry according to the schematic circuit diagram in FIG. 2*b*. The device is constructed as a layered multilayer circuit and comprises a plurality of layers of printed conductive paths that are separated from each other via dielectric layers, stacked one on top of the other, and joined together in a process to form a device. Such a layer process technology is, for example, used in so-called LTCC (low temperature co-fired ceramics) technology, in which conductive paths and electrical components are applied to films via photochemical processes or via printing processes. The films are, for example, implemented as thin ceramic green films and are structured individually. The carrier substrates are then stacked, laminated, and, for example, sintered and pressed in a high-temperature process. However, the multilayer circuit can also be constructed from films of an organic material, for example, FR4 material.

The directional coupler 1 initially has a first high-frequency line 2 and a second high-frequency line 3 in an inner, lower layer plane. These lines are correspondingly applied and structured on a first film or a first layer structure and pressed into the component. Connections 11*a* and 11*b* and 12*a* and 12*b* of the two high-frequency lines 2 and 3 are led outward from the directional coupler 1 in order to make contact with a signal path in a transmitting/receiving apparatus. The connections face downward.

In an upper, preferably the uppermost layer plane of the directional coupler 1, a coupling line 4 is arranged in the form of imprinted conductive paths. The printed conductive paths can, for example, be generated by applying silver paste to the uppermost substrate layer (film) of the directional coupler 1 in a printing process. In particular, the coupling line 4 has a centrally located segment 45*a* that is arranged immediately above the high-frequency lines 2 and 3 and is equipped such that high-frequency signals can be at least partially directionally coupled out of the high-frequency lines 2 and 3 into the central region 45*a*. Individual segments of the coupling line 4 can differ in length and/or width in order to determine their respective impedance values.

Measurement connections 7*a* and 7*b* serve to tap the coupled-out signals, in particular, to route the signals to one or a plurality of detector units (not shown), between which the central segment 45*a* is arranged. Additional segments having a first end 9*a* respectively originate at the segment 45*a*, which lead away from the central segment 45*a* and are respectively connected to a ground connection 8 with a second end 9*b*.

Three additional segments respectively routed approximately parallel to each other and running transverse to the central segment 45*a* thus result on both sides of the central segment 45*a*, wherein the respective middle segments are directly connected to the ground connection 8, and the respective outer segments likewise make contact with ground potential via a web 13 positioned on the outside. The web 13 can be fabricated from a material that is different than that of the coupling line 4 itself. In particular, the web 13 can be formed from a material having extremely low resistivity in order to enable a good ground connection.

The segments respectively have predetermined impedances due to their respective widths and dimensions or due to their cross-sections and depending on the respective length of the segments. Exemplary segments 5*a*, 5*b*, 5*c* and 15*a*, 15*b*, 15*c* are indicated on one side of the central segment 45*a*, which can respectively have different impedance values. The segments 5*c* and 15*c* can form a uniform segment having one impedance value or can respectively define different regions of the middle segment respectively having different impedance values. Similarly to segments 5*a*, 5*b*, 5*c* and 15*a*, 15*b*, 15*c*, corresponding segments are also arranged on the other side of the central segment 45*a* so that all segments leading away from the central segment 45*a* can have different impedance values.

Because of the interconnection of the coupling line 4 with measurement connections 7*a* and 7*b* or with ground connections 8, and because of the geometric embodiment of the coupling line 4 as a region having a central segment 45*a* and additional segments leading outward (for example, 5*a*, 5*b*, 5*c* and 15*a*, 15*b*, 15*c*), it is possible to form resistive matching elements. Thus, for example, the three segments 5*a*, 5*b* and 5*c* form a matching element on one side of the central segment 45*a*, optionally with the central segment 45*a* itself, wherein a resistive PI element is formed due to the arrangement of segments 5*a*, 5*b* and 5*c*. Segments 15*a*, 15*b*, and 15*c* also form such an additional matching element in a PI interconnection.

By dimensioning the segments that originate at the central segment 45*a* differently, it is thus possible to generate different attenuation and matching properties in different regions of the coupling line 4. Thus, the coupling line 4 has, for example, attenuation and matching properties related to the coupled-out signals of the first high-frequency line 2 that are different from those related to coupled-out signals from the second high-frequency line 3.

A region having printed conductive paths of a coupling line 4 according to the embodiment in FIG. 3 thus makes it possible to couple out high-frequency signals of different frequency ranges from a first high-frequency line 2 and a second high-frequency line 3 into the coupling line 4, to attenuate them via resistive attenuation properties of the coupling line 4, and then to feed them to one or a plurality of downstream detectors via measurement connections 7*a* and 7*b*. It is thus possible to couple out from different high-frequency lines 2 and 3 via such a directional coupler 1.

Exact impedance values of the segments (for example, 5*a*, 5*b*, 5*c* and 15*a*, 15*b*, 15*c*) can be achieved, for example, by generating conductive paths by applying conductive paste to the uppermost substrate layer of the directional coupler 1 and then adjusting their resistance values via laser trimming. Laser trimming means that minuscule quantities of the conductive paste are removed via a laser, causing the resistance value to increase in the respective segment. This makes it possible to adjust a wide variety of resistive properties in various regions of the coupling line 4. The coupling line 4 with its conductive paths is advantageously applied only after the multilayer substrate is sintered. This is because sintering causes changes in volume in the component that would make an exact adjustment of desired impedance values in the individual segments more difficult. By subsequently printing the coupling line 4 and performing the laser trimming as described, it is possible to make highly precise adjustments of the impedance values.

The directional coupler 1 according to FIG. 3 constitutes a compact, space-saving component that can be constructed in a cost-efficient manner. Such an embodiment makes it possible to achieve good coupling factors both in a first frequency range of a first high-frequency line 2 and in a second frequency range of a second high-frequency line 3, for example, in different frequency bands according to a mobile radio standard. In a low frequency band, for example, a coupling factor of between −30 and −40 dB with decoupling of up to −80 dB is thus possible. Such a coupling factor with corresponding decoupling can likewise be achieved for the higher frequency band.

In embodiments that are not shown, a directional coupler 1 can also be constructed such that printed conductive paths of the two high-frequency lines 2 and 3 are arranged in a common plane with the coupling line 4. The coupling line 4 could, for example, be arranged between the two high-frequency lines 2 and 3. This also has the advantage that the region with the printed conductive paths of the coupling line 4 is embedded in the component and protected from destruction via external environmental influences.

It is also conceivable to vary the geometric design and dimensions of the coupling line 4 according to the application. Individual segments (for example, 5*a*, 5*b*, 5*c* and 15*a*, 15*b*, 15*c*) could thus be arranged such that matching elements in a T form result.

The arrangement and interconnection with measurement connections 7*a* and 7*b* and ground connections 8 can also be designed differently, depending on the application.

A directional coupler 1 can also consist simply of superimposed layers of printed films that are merely laminated. A wide variety of thin-film or thick-film process technologies can be employed. For example, silver, gold, or copper pastes can be used as conductive paste for printing the individual layers of a directional coupler 1.

The invention claimed is:

1. A directional coupler comprising:

a first high-frequency line for carrying a first high-frequency signal, a second high-frequency line for carrying a second high-frequency signal, and a coupling line for coupling out signals from the first and the second high-frequency lines, wherein the coupling line has resistive segments that respectively have a predetermined impedance, wherein the directional coupler has no discrete resistive components and is constructed as a layered multilayer circuit, wherein the coupling line is implemented from printed conductive paths and has measurement connections for tapping the coupled-out signals, as well as one or a plurality of ground connections, wherein the conductive paths of the coupling line are arranged in a common plane and are formed from electrically conductive paste that is printed on a substrate, wherein the coupling line includes a central segment for conducting coupled-out signals between the measurement connections, as well as additional resistive segments, which respectively originate with a first end at the central segment, lead away from this central segment, and are respectively connected with their second end to one of the ground connections, the central segment being located on a different layer plane of the multilayer circuit than a layer plane of the multilayer circuit having the first high-frequency line or the second high-frequency line, wherein the resistive segments are formed from predetermined dimensions and/or a predetermined cross-section of a layer of the electrically conductive paste.

2. The directional coupler according to claim 1, wherein the coupling line is equipped to couple out signals of a first frequency range from the first high-frequency line and signals of a second frequency range from the second high-frequency line.

3. The directional coupler according to claim 1, wherein the resistive segments are arranged such that one or a plurality of resistive matching elements are formed for matching coupled-out signals.

4. The directional coupler according to claim 3, wherein the matching elements are equipped to attenuate the coupled-out signals of at least one of the frequency ranges and/or to match the impedance of the directional coupler in at least one of the frequency ranges.

5. The directional coupler according to claim 3, wherein the resistive matching elements are arranged in a PI form and form one or a plurality of PI elements for matching in one or a plurality of frequency ranges.

6. The directional coupler according to claim 1 in a mobile telephone.

7. The directional coupler according to claim 2, wherein the resistive segments are arranged such that one or a plurality of resistive matching elements are formed for matching coupled-out signals.

8. The directional coupler according to claim 7, wherein the matching elements are equipped to attenuate the coupled-out signals of at least one of the frequency ranges and/or to match the impedance of the directional coupler in at least one of the frequency ranges.

9. The directional coupler according to claim 8, wherein the resistive matching elements are arranged in a PI form and form one or a plurality of PI elements for matching in one or a plurality of frequency ranges.

10. Directional coupler according to claim 1, wherein the additional resistive segments are guided on both sides of the central segment and normal to the central segment, and wherein at least three of the additional resistive segments are present on each of the two sides of the central segment and are running approximately parallel to each other.

11. Directional coupler according to claim 10, wherein the additional resistive segments comprise a pi-form, wherein the middle ones of the resistive segments are directly connected to the ground connection, and the respective outer segments likewise make contact with ground potential via a web positioned on the outside.

12. Directional coupler according to claim 11, wherein the web is fabricated from a material that is different than that of the coupling line.

* * * * *